(12) United States Patent
Murakami et al.

(10) Patent No.: US 6,963,227 B2
(45) Date of Patent: Nov. 8, 2005

(54) APPARATUS AND METHOD FOR PRECHARGING AND DISCHARGING A DOMINO CIRCUIT

(75) Inventors: Hiroaki Murakami, Austin, TX (US); Shoji Onishi, Austin, TX (US); Osamu Takahashi, Round Rock, TX (US)

(73) Assignees: Toshiba America Electronic Components, Inc., Irivne, CA (US); International Business Machines Corporation, Armonk, NY (US)

( * ) Notice: Subject to any disclaimer, the term of this patent is extended or adjusted under 35 U.S.C. 154(b) by 2 days.

(21) Appl. No.: 10/295,424

(22) Filed: Nov. 15, 2002

(65) Prior Publication Data

US 2004/0095160 A1 May 20, 2004

(51) Int. Cl.[7] ............................................. H03K 19/094
(52) U.S. Cl. .............................. 326/95; 326/98; 326/105; 326/106
(58) Field of Search .............................. 326/93–98, 105, 326/106

(56) References Cited

U.S. PATENT DOCUMENTS

| 4,692,637 A | * | 9/1987 | Shoji | 326/94 |
| 5,828,234 A | * | 10/1998 | Sprague | 326/98 |

* cited by examiner

*Primary Examiner*—Anh Q. Tran
(74) *Attorney, Agent, or Firm*—Hogan & Hartson, LLP

(57) ABSTRACT

A domino circuit configuration includes a precharge transistor coupled to a discharge transistor, wherein the precharge transistor and the discharge transistor are not on simultaneously.

8 Claims, 4 Drawing Sheets

APPARATUS AND METHOD FOR PRECHARGING AND DISCHARGING A DOMINO CIRCUIT

FIELD OF THE INVENTION

The present invention relates to domino circuits, and in particular, to domino circuits having a precharge transistor coupled to a discharge transistor where the precharge transistor and the discharge transistor are not on simultaneously.

BACKGROUND OF THE INVENTION

Domino circuits are widely used as memory devices in integrated circuits. Domino circuits operate in one of two distinct phases. In the first phase, called the precharge phase, a node is precharged to a first potential. In the second phase, called the discharge phase, the node is discharged and the signal output from the domino logic circuit represents the state of a memory cell included in the domino circuit. Included in the domino circuit are a precharge transistor and a discharge transistor which control precharging and discharging, respectively.

One prior art domino circuit configuration 10 is depicted in FIG. 1, which illustrates a first domino circuit 12 and a second domino circuit 14. The first domino circuit includes eight memory cells 16 (only one of the eight memory cells is shown), eight discharge transistor pairs 18 (only one of the eight readout transistor pairs is shown) that each include a read enable transistor 20 and a memory cell transistor 22, and a first precharge transistor 24. The second domino circuit includes eight discharge transistors 26 and a second precharge transistor 28.

Also shown in FIG. 1, various digital signals are input or internal to, or output from the domino circuit configuration. In particular, signal rwl0 is a control signal used to enable readout of data from the memory cell 16. Signal rwl0_buf is the signal rwl0 after passing through a first buffer 30. Signal rwl0_buf is input to the gate 32 of the read enable transistor 20, and thus, controls the readout of data from the memory cell.

Signal lblpch_b is a control signal utilized to precharge signal lbl. Signal lblpch_buf_b is signal lblpch_b after passing through a second buffer 36. Signal lblpch_buf_b is input to the gate 38 of a first precharge transistor 24, and thus, signal lblpch_buf_b controls the precharging of the first domino circuit 12 via signal lbl which is input to the drain 40 of the read enable transistor 20 and also the input 42 of a first inverter 44. Signal lbl becomes signal lbl_b after passing through the first inverter. Signal lbl_b is input to the gate 34 of the discharge transistor 26 which turns on when signal lbl_b transitions from "low" or "logic level 0" to "high" or "logic level 1". Correspondingly, the discharge transistor turns off when signal lbl_b transitions from logic level 1 to logic level 0.

Signal gblpch_b is a control signal utilized to precharge signal gbl which is input to the drain 46 of the discharge transistor 26. Signal gblpch_b becomes signal gbl_b after passing through a third buffer 48. Signal gbl_b is input to the gate 50 of a second precharge transistor 28, and thus, signal gbl_b controls the precharging of the second domino circuit 14 via signal gbl which is output from the second precharge transistor's source 52 and input to the discharge transistor's drain 46. Signal output is the digital signal output from the domino circuit configuration 10.

FIG. 2 is a timing diagram that illustrates the waveform for each of the digital signals and shows the timing relationship between the waveforms. In particular, FIG. 2 shows that Tr_dly1 is the time delay between the rising edges 60 and 62, respectively, of signals rwl0 and rwl0_buf, the time delay between the rising edges 64 and 66, respectively, of signals lblpch_b and lblpch_buf_b, and the time delay between the rising edges 68 and 70, respectively, of signals gblpch_b and gbl_b. Likewise, Tf_dly1 is the time delay between the falling edges 72 and 74, respectively, of signals rwl0 and rwl0_buf, the time delay between the falling edges 76 and 78, respectively, of signals lblpch_b and lblpch_buf_b, and the time delay between the falling edges 80 and 82, respectively, of signals gblpch_b and gbl_b. Tf_dly_lbl is the time delay between the rising edge 66 of signal lblpch_buf_b and the falling edge 84 of signal lbl. Likewise, Tr_dly_lbl is the time delay between the falling edge 78 of signal lblpch_buf_b and the rising edge 86 of signal lbl. Tr_dly2 is the time delay between the falling edge 84 of signal lbl and the rising edge 88 of signal lbl_b. Tf_dly2 is the time delay between the rising edge 86 of signal lbl and the falling edge 90 of signal lbl_b. Tf_dly_rwl02gbl is the time delay between the rising edges 60 and 88, respectively, of signals rwl0 and lbl_b. Tr_dly_lblpch_b2gbl is the time delay between the falling edges 72 and 90, respectively, of signals rwl0 and lbl_b.

Referring additionally to FIG. 1, the domino circuit configuration 10 of FIG. 1 operates as follows. When signal rwl0 is at logic level 1, the state of the memory cell 16 can be read when signal lblpch_b is at logic level 1. Also, the first precharge transistor 24 turns on when signal lblpch_buf_b transitions from logic level 1 to logic level 0, and turns off when signal lblpch_buf_b transitions from logic level 0 to logic level 1. In contrast, the second precharge transistor 28 turns on when signal gbl_b transitions from logic level 1 to logic level 0 and turns off when signal gbl_b transitions from logic level 0 to logic level 1. The discharge transistor 26 turns on when signal lbl_b transitions from logic level 0 to logic level 1 and turns off when signal lbl_b transitions from logic level 1 to logic level 0.

However, because Tr_dly1, the time delay from the trailing edge 80 of signal gblpch_b to the trailing edge 82 of signal gbl_b, is shorter than Tr_dly_blpch_b2gbl, the time delay from the trailing edge 76 of signal lblpch_b to the trailing edge 90 of signal lbl_b, both the precharge transistor 28 and the discharge transistor 26 are on simultaneously as shown in FIG. 2. As a result, direct current flows through both the second precharge transistor and the discharge transistor in the circuit depicted in FIG. 1 as indicated by the bold arrow 92. The flow of direct current through both the second precharge transistor and the discharge transistor results in power inefficiencies. Thus, there is a need for a domino circuit configuration which prevents the flow of direct current between precharge and discharge transistors.

SUMMARY OF THE INVENTION

An exemplary domino circuit configuration that embodies the invention includes a precharge transistor coupled to a discharge transistor, wherein the precharge transistor and the discharge transistor are not on simultaneously.

Another domino circuit configuration includes a first domino circuit and a second domino circuit. The first domino circuit includes a first precharge transistor coupled to a first discharge transistor. The second domino circuit includes a second precharge transistor coupled to a second discharge transistor, wherein the second discharge transistor and the second precharge transistor are not on simultaneously.

Another domino circuit configuration includes a first domino circuit and a second domino circuit. The first domino circuit includes a first precharge transistor coupled to a discharge transistor pair. The second domino circuit includes a second precharge transistor coupled to a discharge transistor, wherein the discharge transistor and the second precharge transistor are not on simultaneously.

A method for precharging and discharging a domino circuit configuration includes turning on a precharge transistor only after turning off a discharge transistor coupled to the precharge transistor, and turning on the discharge transistor only after turning off the precharge transistor.

Other aspects of the present invention will become readily apparent to those skilled in the art from the following detailed description, which shows and describes exemplary embodiments of the invention, simply by way of illustration of the best mode contemplated for carrying out the invention. The invention is capable of other and different embodiments, and its several details are capable of modifications in various respects, all without departing from the invention. Accordingly, the drawings and description are to be regarded as illustrative in nature, and not as restrictive.

BRIEF DESCRIPTION OF THE DRAWINGS

Various features, aspects, and advantages of the invention will be better understood with regard to the following description, appended claims, and accompanying drawings where:

DETAILED DESCRIPTION OF THE PREFERRED EMBODIMENTS

Figure 1:
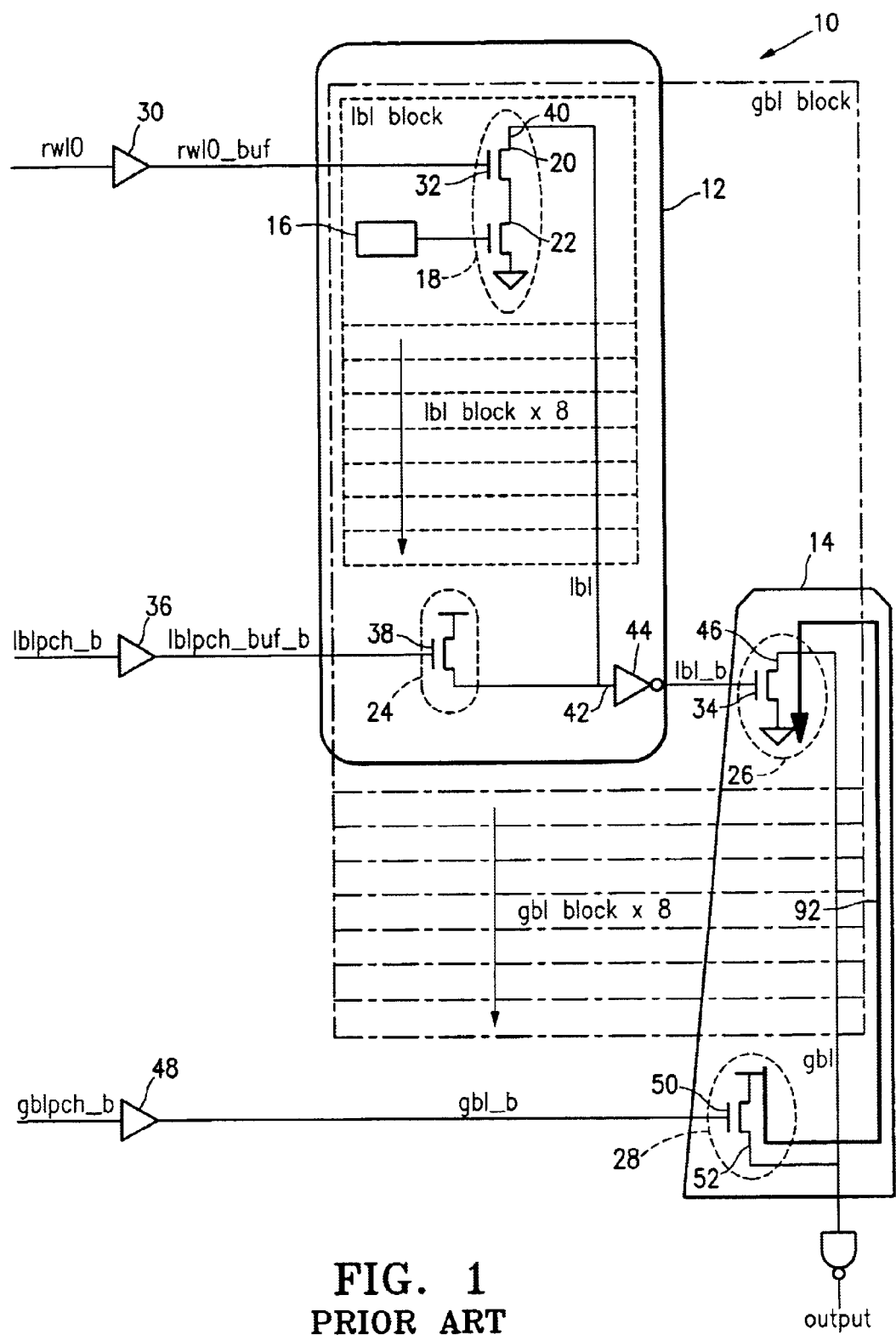
FIG. 1 is a schematic diagram of a prior art domino circuit configuration.
Figure 2:
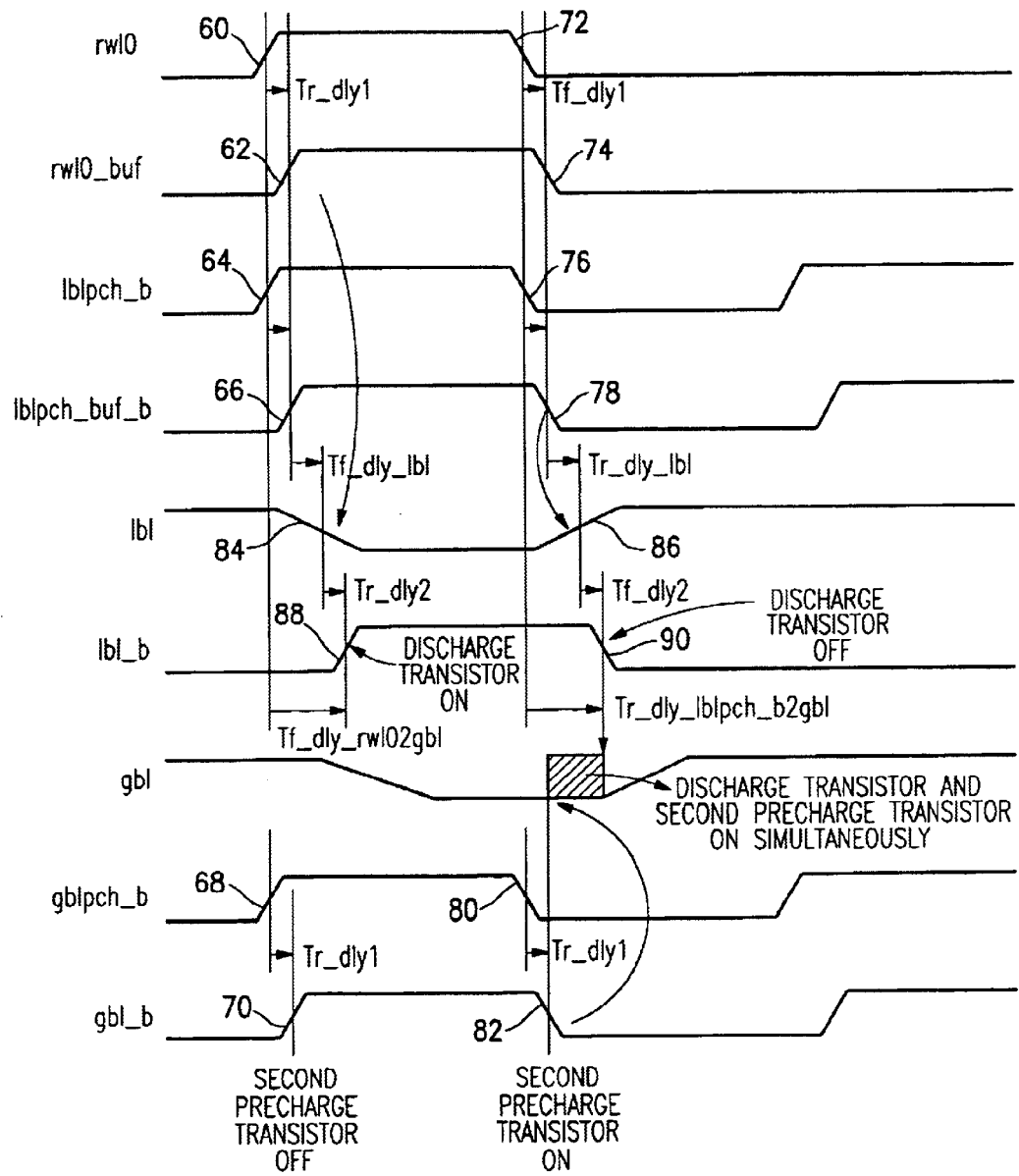
FIG. 2 is a timing diagram showing the operation of the domino circuit configuration of FIG. 1.
Figure 3:
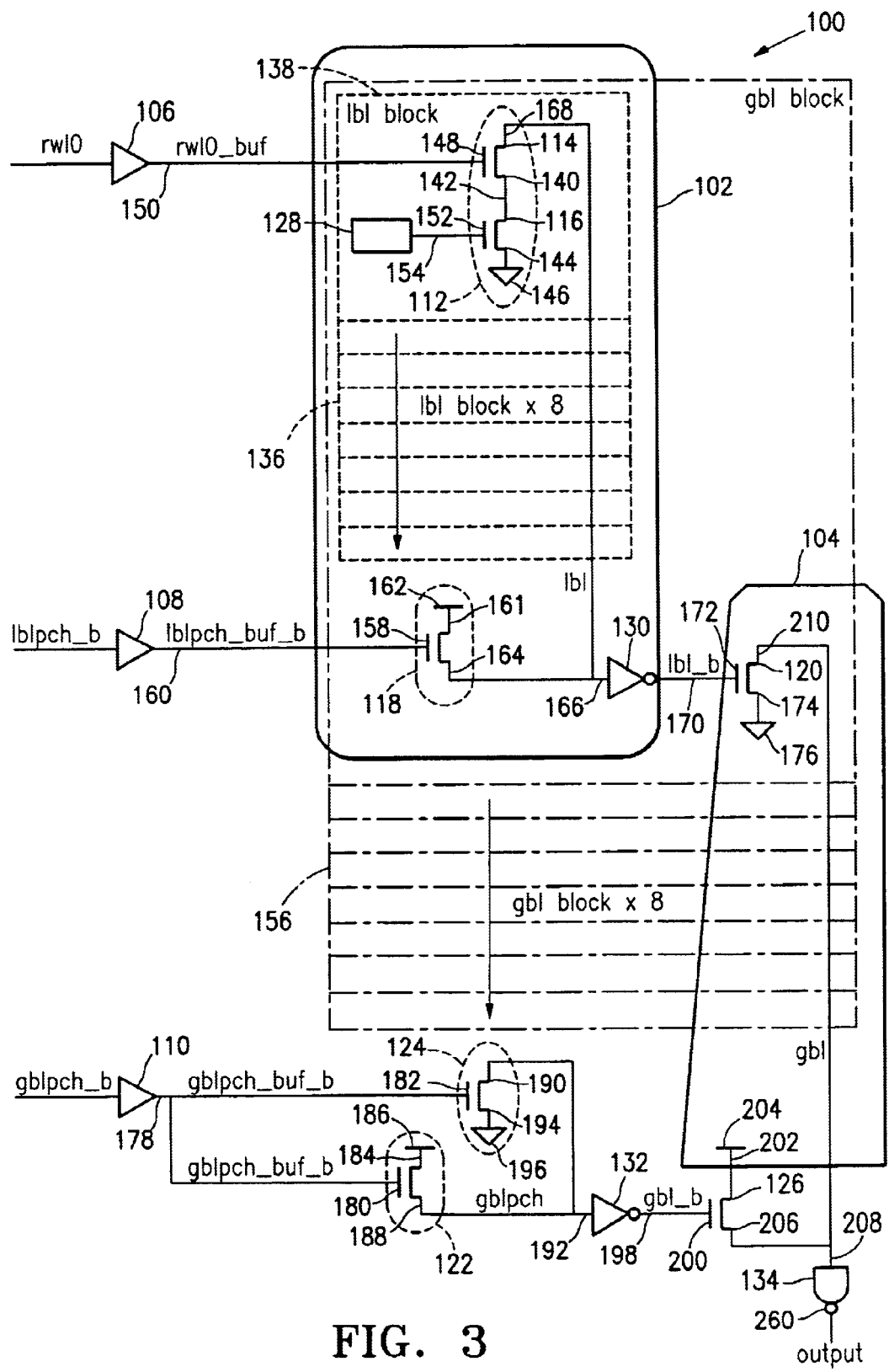
FIG. 3 is a schematic diagram of an embodiment of a domino circuit configuration according to the present invention.

FIG. 3 is a schematic diagram of an embodiment of a domino circuit configuration 100 according to the present invention that includes a first domino circuit 102 and a second domino circuit 104. The domino circuit configuration depicted in FIG. 3 also includes a first buffer 106, a second buffer 108, and a third buffer 110. In addition, the domino circuit configuration also includes a discharge transistor pair 112 including a read enable transistor 114 and a memory cell transistor 116, a first precharge transistor 118, a discharge transistor 120, a precharge enable transistor 122, a precharge disable transistor 124, and second precharge transistor 126. The embodiment also includes a memory cell 128, a first inverter 130, a second inverter 132, and a NAND gate 134. All, or a portion of, the components depicted in FIG. 3 can be configured within a single electronic chip (not shown). In other embodiments, one or more of the components are included in individual electronic chips (not shown).

As indicated in FIG. 3, the first domino circuit 102 includes eight lbl blocks 136, the first precharge transistor 118, and first inverter 130. Each lbl block, as exemplified in the first lbl block 138, includes the memory cell 128 and the discharge transistor pair 112 made up of the read enable transistor 114, also referred to as the first discharge transistor 114, coupled to the memory cell transistor 116. The source 140 of the read enable transistor is coupled the drain 142 of the memory cell transistor. The source 144 of the memory cell transistor is coupled to ground potential 146. The gate 148 of the read enable transistor is coupled to the output 150 of the first buffer 106. The gate 152 of the memory cell transistor is coupled to an output 154 of the memory cell.

As indicated in FIG. 3, there are eight gbl blocks 156. Each lbl block 138 is included in one of the gbl blocks. Each gbl block also includes a first precharge transistor 118, a first inverter 130, and a discharge transistor 120, also referred to as the second discharge transistor 120. The first precharge transistor's gate 158 is coupled to an output 160 of the second buffer 108. The first precharge transistor's drain 161 is coupled to a voltage potential 162 representative of logic level 1. The first precharge transistor's source 164 is coupled to the first inverter's input 166 and the read enable transistor's drain 168. The output 170 of the first inverter 130 is coupled to the discharge transistor's gate 172. The discharge transistor's source 174 is coupled to ground potential 176. The second domino circuit 104 includes the discharge transistor 120 for each of the eight gbl blocks.

The third buffer 110 of the domino circuit configuration 100 has an output 178 that is coupled to the gates 180 and 182, respectively, of both the precharge enable transistor 122 and the precharge disable transistor 124. The precharge enable transistor's drain 184 is coupled to a voltage potential 186 representative of logic level 1. The precharge enable transistor's source 188 is coupled to the precharge disable transistor's drain 190 and the second inverter's input 192. The precharge disable transistor's source 194 is coupled to ground potential 196. The second inverter's output 198 is coupled to the second precharge transistor's gate 200. The second precharge transistor's drain 202 is coupled to a voltage potential 204 representative of logic level 1. The second precharge transistor's source 206 is coupled to both the input 208 of the NAND gate 134 and the discharge transistor's drain 210.

As shown in FIG. 3, various digital signals are input or internal to, and output from the domino circuit configuration 100. The input signals include signal rwl0, lblpch_b, and gblpch_b that are input to the first, second, and third buffers, 106, 108, and 110, respectively. Signals rwl0_buf, lblpch_buf_b, and gblpch_buf_b are the signals that are time delayed by, and output from, the first, second, and third buffers, respectively. Signal rwl0_buf is a control signal used to enable reading of data stored in the memory cell 128. Signal rwl0_buf is input to the read enable transistor's gate 148. The read enable transistor 114 turns on when signal rwl0_buf transitions from logic level 0 to logic level 1, and turns off when signal rwl0_buf transitions from logic level 1 to logic level 0. Similarly, the memory cell transistor 116 is on when the signal output from the memory cell to the gate 152 of the memory cell transistor is logic level 1. In contrast, when the signal output from the memory cell to the gate of the memory cell transistor is logic level 0, the memory cell transistor is off.

Similarly, signal lblpch_buf_b is a first precharge control signal that is input to the gate 158 of the first precharge transistor 118. The first precharge transistor turns off when signal lblpch_buf_b transitions from logic level 0 to logic level 1, and turns on when signal lblpch buf_b transitions from logic level 1 to logic level 0. The first precharge transistor's drain 161 is connected to a voltage potential 162 representative of logic level 1. When the first precharge transistor 118 is on and the read enable transistor 114 is off, a voltage potential representative of logic level 1 is established on the conductor that couples the first precharge transistor's source 164 to the read enable transistor's drain 168 and the first inverter's input 166, and thus, signal lbl is set to logic level 1. Thus, signal lblpch_b is a control signal used to bring signal lbl to logic level 1 and precharge the discharge transistor pair 112. Later, when the first precharge transistor is off and the read enable transistor 114 and memory cell transistor 116 are on, the charge developed on the conductor that couples the first precharge transistor's source to the read enable transistor's drain and the first inverter's input flows through the read enable transistor and memory cell transistor to ground 146, thus pulling signal lbl to logic level 0. Signal lbl is inverted and time delayed by the first inverter 130 resulting in signal lbl_b that is output from the first inverter and input to the discharge transistor's gate 172. The discharge transistor 120 turns on when signal lbl_b transitions from logic level 0 to logic level 1, and turns off when signal lbl_b transitions from logic level 1 to logic level 0.

Signal gblpch_b is input to the third buffer 110 that time delays signal gblpch_b before it is output from the third buffer as signal gblpch_buf_b. Signal gblpch_buf_b is a second precharge control signal that is input to the gates 180 and 182, respectively, of both the precharge enable transistor 122 and the precharge disable transistor 124. The precharge enable transistor turns off when signal gblpch_buf_b transitions from logic level 0 to logic level 1, and turns on when signal gblpch_buf_b transitions from logic level 1 to logic level 0. In contrast, the precharge disable transistor turns on when signal gblpch_buf_b transistions from logic level 0 to logic level 1, and turns off when signal gblpch_buf_b transitions from logic level 1 to logic level 0. When the precharge enable transistor is on and the prechage disable transitor is off, a potential representative of logic level 1 is established on the conductor that couples the precharge enable transistor's source 188 to the precharge disable transistor's drain 190 and the second inverter's input 192, and signal gblpch is set to logic level 1. However, when the precharge enable transistor is off and the precharge disable transistor is on, charge build up on the conductor that couples the precharge enable transistor's source to the precharge disable transistor's drain and the second inverter's input flows through the precharge disable transistor to ground 196 resulting in signal gblpch being pulled to logic level 0.

Signal gbl_b is the inverted and time delayed version of signal gblpch. Signal gbl_b is output from the second inverter 132 and input to the second precharge transistor's gate 200. The second precharge transistor 126 turns off when signal gbl_b transitions from logic level 0 to logic level 1, and turns on when signal gbl_b transitions from logic level 1 to logic level 0. Signal gbl is established at the second precharge transistor's source 206, the discharge transistor's drain 210, and the input 208 to the NAND gate 134. When the second precharge transistor is on, and the discharge transistor 120 is off, a reference potential representative of logic level 1 is established on the conductor that couples the second precharge transistor's source to the discharge transistor's drain and the NAND gate's input, and signal gbl is set to logic level 1. In contrast, when the second precharge transistor is off, and the discharge transistor 120 is on, charge accumulated on the conductor that couples the second precharge transistor's source to the discharge transistor's drain 210 and the NAND gate's input flows through the discharge transistor 120 to ground and signal gbl is pulled to logic level 0. Thus, input signal gblpch_b is used to control the precharging of signal gbl. Signal output is output from the NAND gate and is the inverted and time delayed version of signal gbl after signal gbl propagates through the NAND gate.

Figure 4:
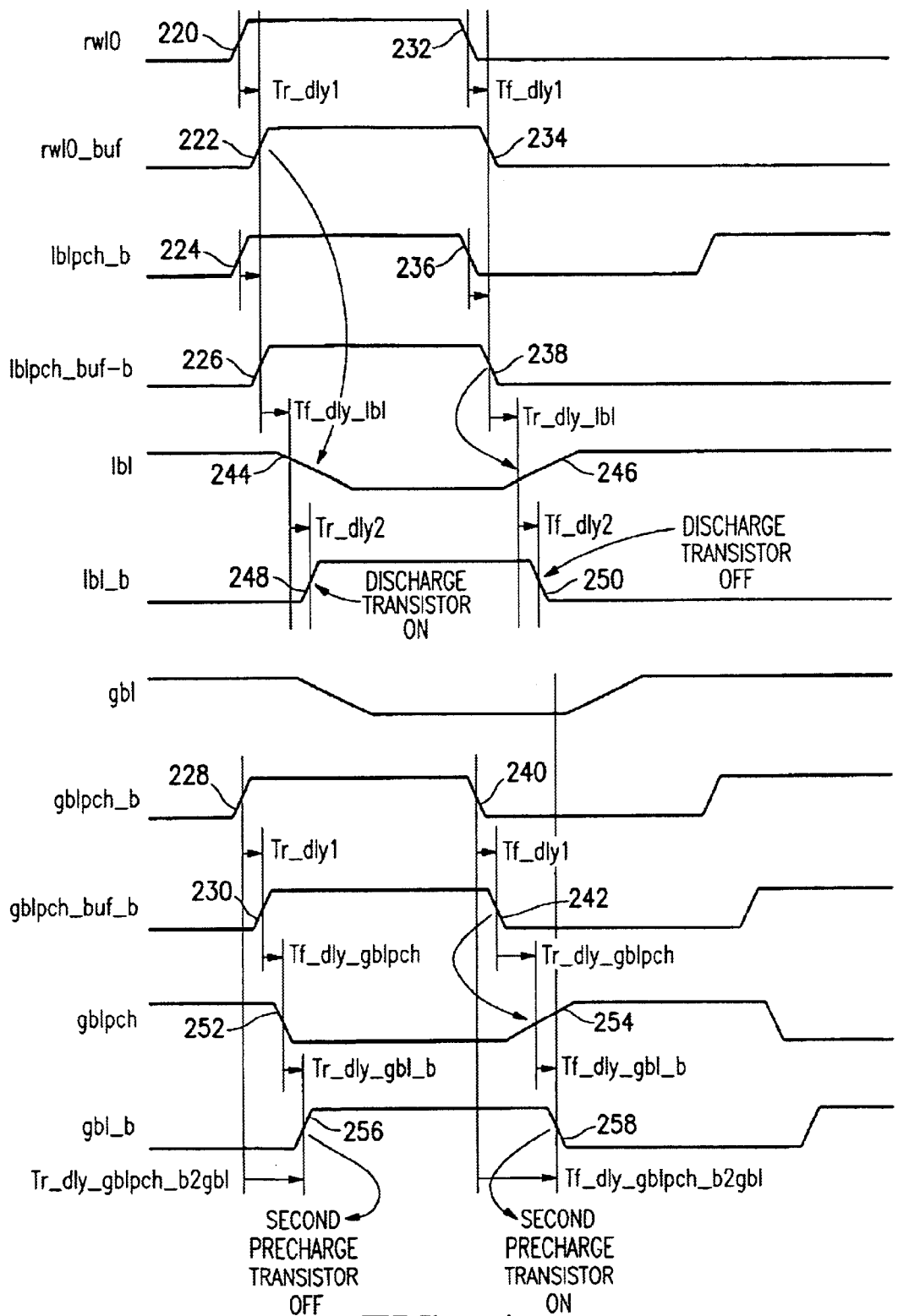
FIG. 4 is a timing diagram showing the operation of the domino circuit configuration of FIG. 3.

FIG. 4, is a timing diagram that illustrates the waveform for each of the signals that are input to, output from, or internal to the domino circuit configuration and the timing relationship; between the waveforms. In particular, Tr_dly1 is the time delay between the rising edges 220 and 222, respectively, of signals rwl0 and rwl0_buf, the time delay between the rising edges 224 and 226, respectively, of signals lblpch_b and lblpch_buf_b, and the time delay between the rising edges 228 and 230, respectively, of signals gblpch_b and gblpch_buf_b. Tf_dly1 is the time delay between the falling edges 232 and 234, respectively, of signals rwl0 and rwl0_buf, the time delay between the falling edges 236 and 238, respectively, of signals lblpch_b and lblpch_buf_b, and the time delay between the falling edges 240 and 242, respectively, of signals gblpch_b and gblpch_buf_b. Tr_dly1 and Tf_dly1 are the delay times inherent in the propagation of a rising edge or falling edge, respectively, through one of the first, second, or third buffers 106, 108, or 110, respectively.

Tf_dly_lbl is the time delay between the rising edge 226 of signal lblpch_buf_b and the falling edge 244 of signal lbl. Time delay Tf_dly_lbl is calculated by multiplying the resistance of the transistor pair 112 added to the resistance of the conductor along which signal lbl travels by the diffusion capacitance of all eight transistor pair drains 118 (only one shown) summed together with the capacitance of the conductor along which signal lbl travels. Tr_dly_lbl is the time delay between the falling edge 238 of signal lblpch_buf_b and the rising edge 246 of signal lbl. Time delay Tr_dly_lbl is calculated by multiplying the resistance of the transistor pair added to the resistance of the conductor along which signal lbl travels by the diffusion capacitance of all eight transistor pair drains (only one shown) summed together with the capacitance of the conductor along which signal lbl travels.

Tr_dly2 is the time delay between the falling edge 244 of signal lbl and the rising edge 248 of signal lbl_b. Tf_dly2 is the time delay between the rising edge 246 of signal lbl and the falling edge 250 of signal lbl_b. Tr_dly2 and Tf_dly2 are the delay times inherent in the propagation of signal through the first inverter 130.

Tf_dly_gblpch is the time delay between the rising edge 230 of signal gblpch_buf_b and the falling edge 252 of signal gblpch. Time delay Tf_dly_gblpch is calculated by multiplying the resistance of the precharge disable transistor 124 by the capacitance of the second inverter's input 192. Tr_dly_gblpch is the time delay between the falling edge 242 of signal gblpch_buf_b and the rising edge 254 of signal gblpch. Time delay Tr_dly_gblpch is calculated by multiplying the resistance of the precharge enable transistor by the capacitance of the second inverter's input. Since the length of conductor along which the signal gblpch travels is short, the capacitance and resistance of the conductor can be ignored.

Tr_dly_gbl_b is the time delay between the falling edge 252 of signal gblpch and the rising edge 256 of signal gbl_b. Tf_dly_gbl_b is the time delay between the rising edge 254 of signal gblpch and the falling edge 258 of gbl_b. Tr_dly_gbl_b and Tf_dly_gbl_b are the delay times inherent in the propagation of signal through the second inverter 132.

Tr_dly_gblpch_b2gbl is the time delay between the rising edge 228 of gblpch_b and the rising edge 256 of signal gbl_b. Delay time Tr_dly_gblpch_b2gbl equals the sum of delay times Tr_dly1, Tf_dly_gblpch, and Tr_dly_gbl_b. Tf_dly_gblpch_b2gbl is the time delay between the falling edge 240 of signal gblpch_b and the falling edge 258 of signal gbl_b. Delay time Tf_dly_gblpch_b2gbl equals the sum of delay times Tf_dly1, Tr_dly_gblpch, and Tf_dly_gbl_b.

Delay time Tf_dly_gblpch is designed to be faster than delay time Tf_dly_lbl due to the resistance of the precharge disable transistor 124 being smaller than the resistance of the discharge transistor pair 112. The resistance of the precharge disable transistor is smaller than the resistance of the discharge transistor pair because the width of the precharge disable transistor's channel (not shown) is wider than the width of the channels (not shown) for the read enable transistor 114 and memory cell transistor 116 that comprise discharge transistor pair 112. In contrast, delay time Tr_dly_gblpch is designed to be slower than delay time Tr_dly_lbl due to the resistance of the precharge enable transistor 122 being larger than the resistance of the first precharge transistor 118. The resistance of the precharge enable transistor is larger than the resistance of the first precharge transistor because the width of the precharge enable transistor's channel (not shown) is smaller than the width of the first precharge transistor's channel (not shown). Since the delay time between signals gblpch_b and gbl_b is faster than the delay time between signals rwl0 and lbl_b, the discharge transistor 120 turns on after the second precharge transistor 126 turns off. Also, since the delay time from gblpch_b to gbl_b is longer than the delay time from lblpch_b to lbl_b, the discharge transistor 120 turns off before the second precharge transistor turns on. Thus, advantageously, the discharge transistor 120 and second precharge transistor of the domino circuit configuration 100 are not on simultaneously, and as a result, the domino circuit configuration can prevent the flow of direct current between the second precharge transistor and the discharge transistor 120. In addition to reducing power inefficiencies, the present invention reduces electrical noise that results from the direct current flow between second precharge transistor and the discharge transistor 120. Therefore, the present invention results in lower power consumption and reduced electrical noise.

In another embodiment, the input of an electronic latch (not shown) is coupled to the NAND gate's output 260. The latch may be included within an electronic chip that includes other components of the domino circuit configuration 100, or may be embodied in a separate electronic component (not shown). A clock signal (not shown) is also input to the latch. Signals are output from the latch depending upon the signal output from the NAND gate 134 and the clock signal.

Moreover, to those skilled in the various arts, the invention itself herein will suggest solutions to other tasks and adaptations for other applications. The present embodiments must therefore be considered in all respects as illustrative and not restrictive. The scope of the invention is not limited to those embodiments, but must be determined instead by the appended claims, along with the full scope of equivalents to which those claims are legally entitled.

What is claimed is:

1. A domino circuit configuration, comprising:
a first domino circuit comprising:
a discharge transistor pair comprising a read enable transistor and a memory cell transistor; and
a first precharge transistor coupled to the discharge transistor pair;
a second domino circuit comprising:
a discharge transistor; and
a second precharge transistor coupled to the discharge transistor; and
a precharge enable transistor coupled to a precharge disable transistor, wherein the precharge enable transistor is used to turn on the second precharge transistor and the precharge disable transistor is used to turn off the second precharge transistor,
wherein outputs of the precharge enable transistor and the precharge disable transistor have a complementary logical relationship relative to an input of the precharge transistor, and
wherein the discharge transistor and the second precharge transistor are not on simultaneously.

2. The domino circuit configuration according to claim 1, further comprising a read control signal input to the read enable transistor.

3. A domino circuit configuration, comprising:
a first domino circuit comprising:
a discharge transistor pair comprising a read enable transistor and a memory cell transistor;
a memory cell coupled to the memory cell transistor such that the memory cell transistor is configured to hold a "0" (Ground level) and a "1" (VDD level); and
a first precharge transistor coupled to the discharge transistor pair;
a second domino circuit comprising;
a discharge transistor; and
a second precharge transistor coupled to the discharge transistor; and
a precharge enable transistor coupled to a precharge disable transistor, wherein the precharge enable transistor is used to turn on the second precharge transistor and the precharge disable transistor is used to turn off the second precharge transistor,
wherein outputs of the precharge enable transistor and the precharge disable transistor have a complementary logical relationship relative to an input of the precharge transistor, and
wherein the discharge transistor and the second precharge transistor are not on simultaneously.

4. A domino circuit configuration, comprising:
a first domino circuit comprising:
a discharge transistor pair; and
a first precharge transistor coupled to the discharge transistor pair;
a second domino circuit comprising:
a discharge transistor; and
a second precharge transistor coupled to the discharge transistor;
a precharge enable transistor coupled to a precharge disable transistor, wherein the precharge enable transistor is used to turn on the second precharge transistor and the precharge disable transistor is used to turn off the second precharge transistor,
wherein outputs of the precharge enable transistor and the precharge disable transistor have a complementary logical relationship relative to an input of the precharge transistor, and
wherein the discharge transistor and the second precharge transistor are not on simultaneously; and
a first inverter coupled between the first precharge transistor and the discharge transistor.

5. A domino circuit configuration, comprising:
a first domino circuit comprising:
a discharge transistor pair; and a first precharge transistor coupled to the discharge transistor pair;

a second domino circuit comprising:

a discharge transistor; and a second precharge transistor coupled to the discharge transistor;

a precharge enable transistor coupled to a precharge disable transistor, wherein the precharge enable transistor is used to turn on the second precharge transistor and the precharge disable transistor is used to turn off the second precharge transistor, wherein outputs of the precharge enable transistor and the precharge disable transistor have a complementary logical relationship relative to an input of the precharge transistor, wherein the discharge transistor and the second precharge transistor are not on simultaneously; and wherein a resistance of the precharge disable transistor is smaller than a resistance of the discharge transistor pair.

6. A domino circuit configuration, comprising:

a first domino circuit comprising:

a discharge transistor pair; and a first precharge transistor coupled to the discharge transistor pair;

a second domino circuit comprising:

a discharge transistor; and a second precharge transistor coupled to the discharge transistor;

a precharge enable transistor coupled to a precharge disable transistor, wherein the precharge enable transistor is used to turn on the second precharge transistor and the precharge disable transistor is used to turn off the second precharge transistor, wherein outputs of the precharge enable transistor and the precharge disable transistor have a complementary logical relationship relative to an input of the precharge transistor, wherein the discharge transistor and the second precharge transistor are not on simultaneously; and wherein a resistance of the precharge enable transistor is larger than a resistance of the first precharge transistor.

7. A domino circuit configuration, comprising:

a first domino circuit comprising:

a discharge transistor pair; and a first precharge transistor coupled to the discharge transistor pair;

a second domino circuit comprising:

a discharge transistor; and a second precharge transistor coupled to the discharge transistor;

a precharge enable transistor coupled to a precharge disable transistor, wherein the precharge enable transistor is used to turn on the second precharge transistor and the precharge disable transistor is used to turn off the second precharge transistor, wherein outputs of the precharge enable transistor and the precharge disable transistor have a complementary logical relationship relative to an input of the precharge transistor, wherein the discharge transistor and the second precharge transistor are not on simultaneously; and wherein a width of a channel of the precharge disable transistor is wider than a width of a channel of the discharge transistor pair.

8. The domino circuit configuration according to claim 7, wherein a width of a channel of the precharge enable transistor is narrower than a width of a channel of the first precharge transistor.

* * * * *